US012727087B1

(12) United States Patent
Yuen et al.

(10) Patent No.: US 12,727,087 B1
(45) Date of Patent: Sep. 1, 2026

(54) DEEP PLUGGABLE RECEPTACLE

(71) Applicant: PicoJool, Inc., Palo Alto, CA (US)

(72) Inventors: Albert T Yuen, Palo Alto, CA (US); Paul K Rosenberg, Santa Cruz, CA (US)

(73) Assignee: PicoJool, Inc., Palo Alto, CA (US)

( * ) Notice: Subject to any disclaimer, the term of this patent is extended or adjusted under 35 U.S.C. 154(b) by 0 days.

(21) Appl. No.: 19/458,384

(22) Filed: Jan. 23, 2026

Related U.S. Application Data

(60) Provisional application No. 63/956,688, filed on Jan. 9, 2026.

(51) Int. Cl.
*H05K 1/18* (2026.01)

(52) U.S. Cl.
CPC ..... *H05K 1/18* (2013.01); *H05K 2201/10325* (2013.01); *H05K 2201/10371* (2013.01)

(58) Field of Classification Search
CPC ........... H05K 1/18; H05K 2201/10325; H05K 2201/10371
USPC ........................................................ 361/760
See application file for complete search history.

(56) References Cited

U.S. PATENT DOCUMENTS

2017/0294748 A1* 10/2017 Engl .................. H05K 7/20436
2021/0367364 A1* 11/2021 Phillips ................ H01R 12/721

* cited by examiner

*Primary Examiner* — Andargie M Aychillhum
(74) *Attorney, Agent, or Firm* — André Grouwstra

(57) ABSTRACT

A receptacle assembly may include a transfer subsystem (562, 1362) to receive a pluggable module (580) and securely engage the pluggable module with an interface (564, 1364). The interface is mechanically coupled with the transfer subsystem and configured to mate with the pluggable module and to reliably transfer optical signals and/or electric signals between the pluggable module and a printed circuit board (PCB) (510, 1210, 1310) and/or another electronic or photonic circuitry coupled with the PCB. The transfer subsystem has a transfer depth of at least 12 centimeters, which is the distance between the entrance (561) of the transfer subsystem and the interface.

17 Claims, 8 Drawing Sheets

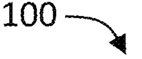
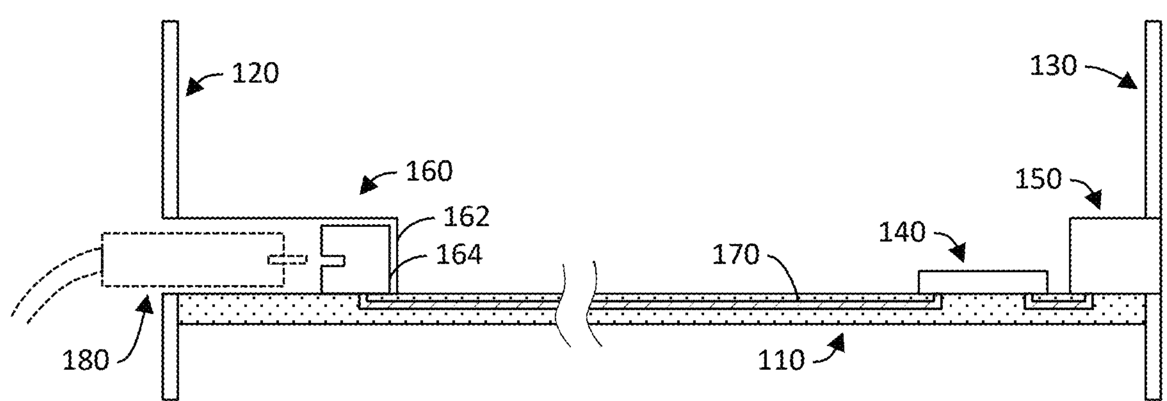
FIG. 1 - Prior Art
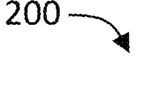
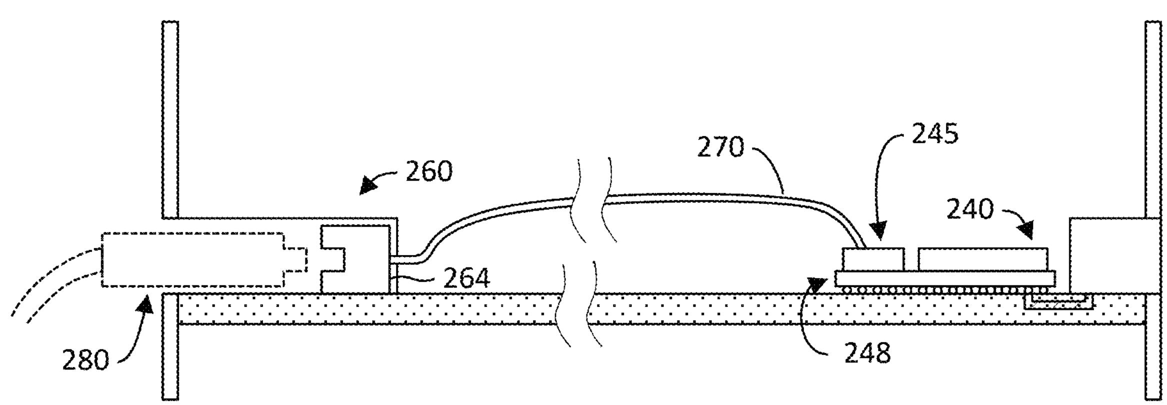
FIG. 2 - Prior Art

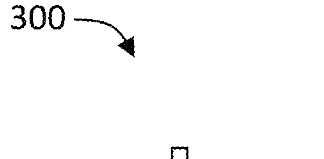
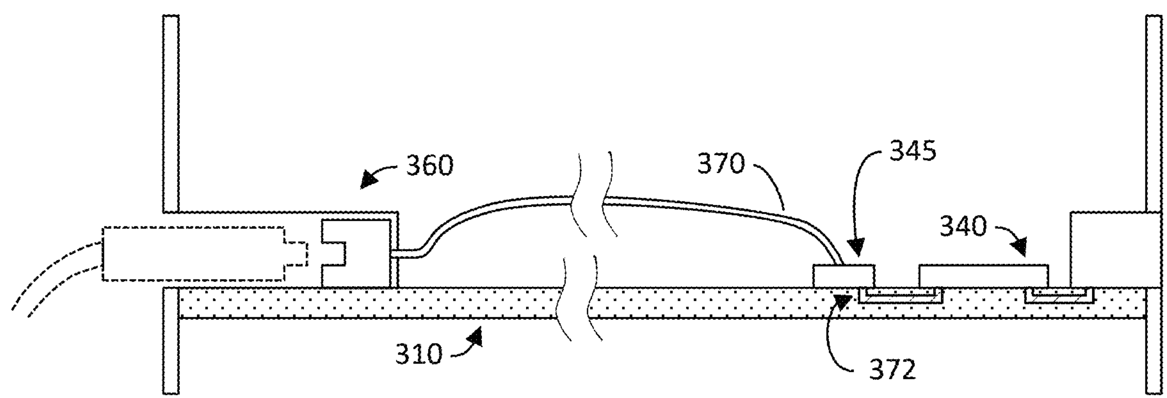
FIG. 3 - Prior Art
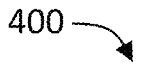
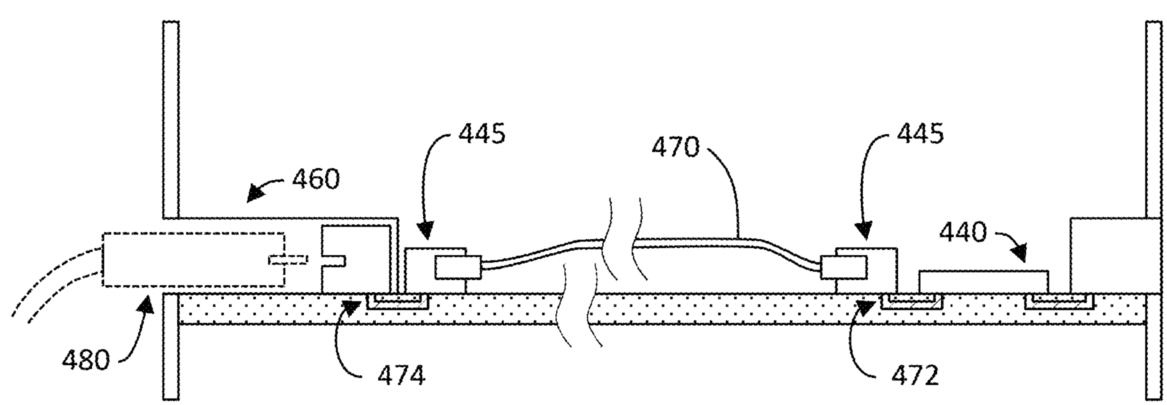
FIG. 4 - Prior Art

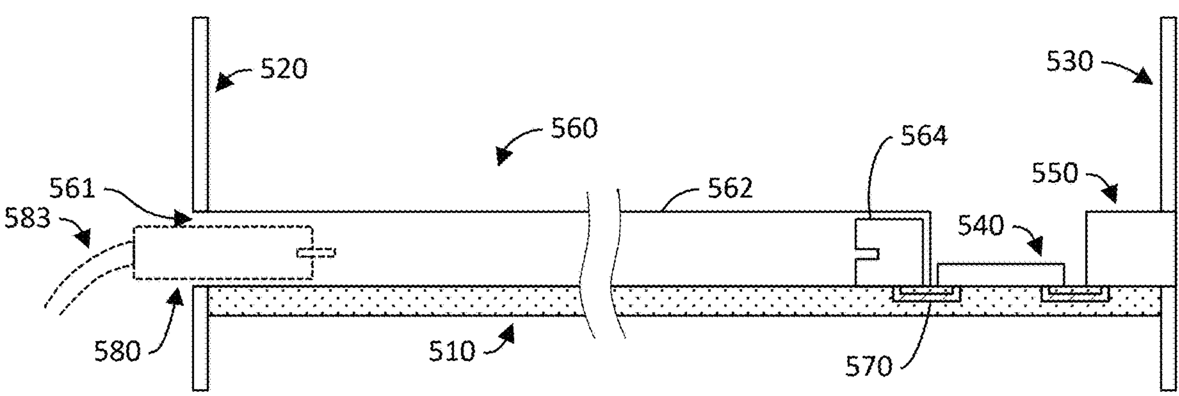
FIG. 5
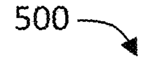
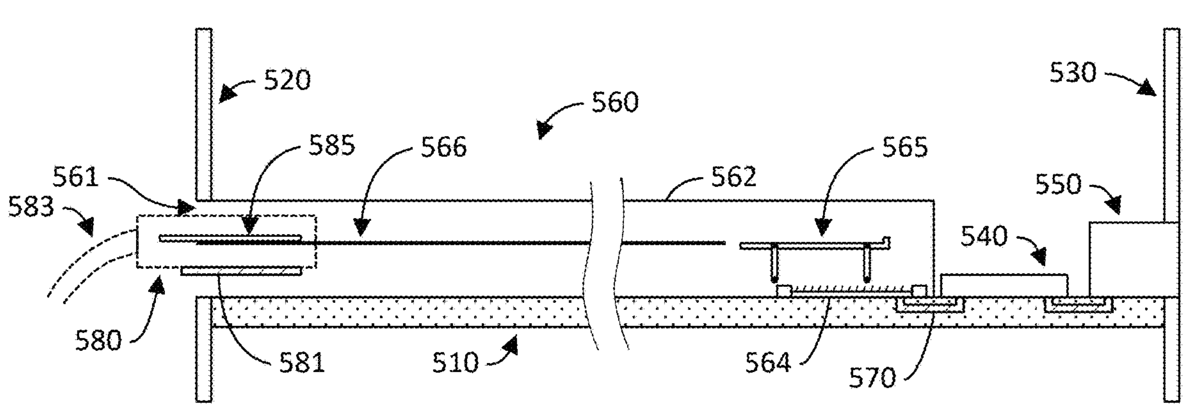
FIG. 6

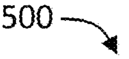
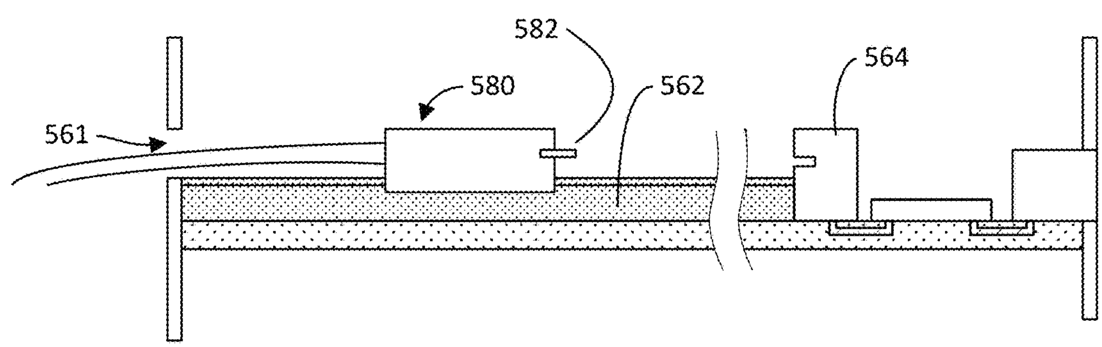
FIG. 7A
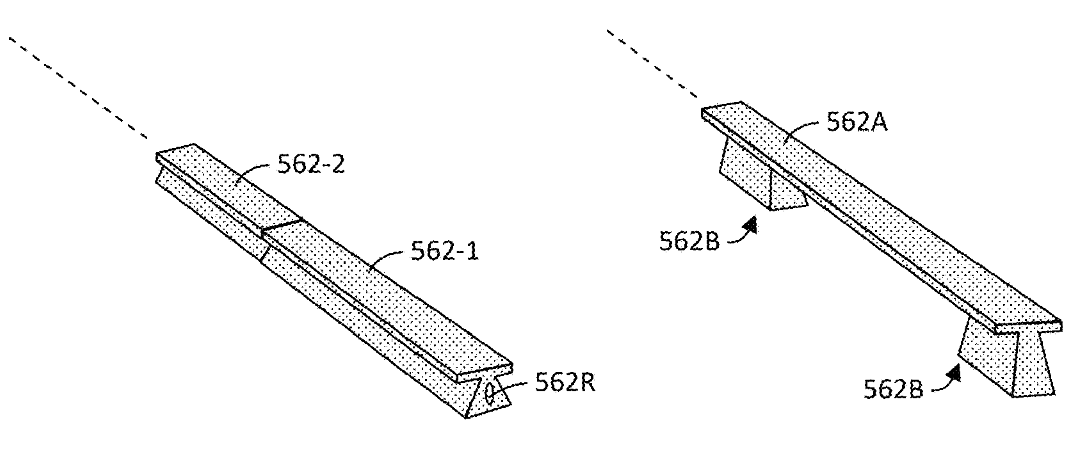
FIG. 7B
FIG. 7C
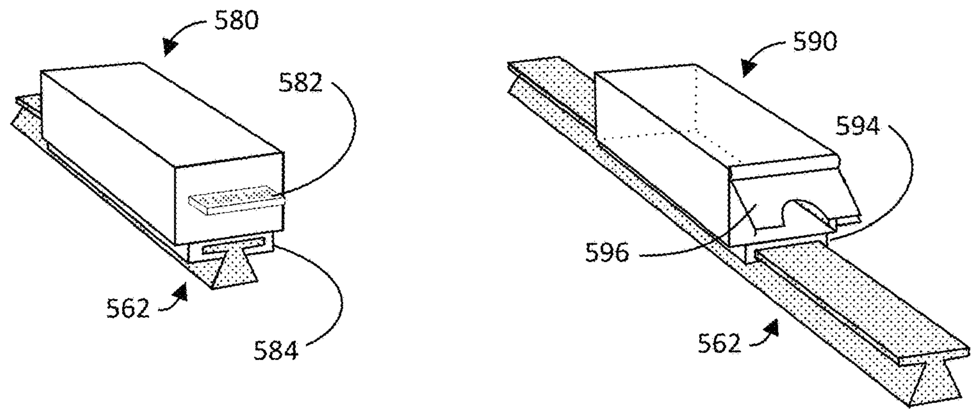
FIG. 8A
FIG. 8B

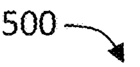
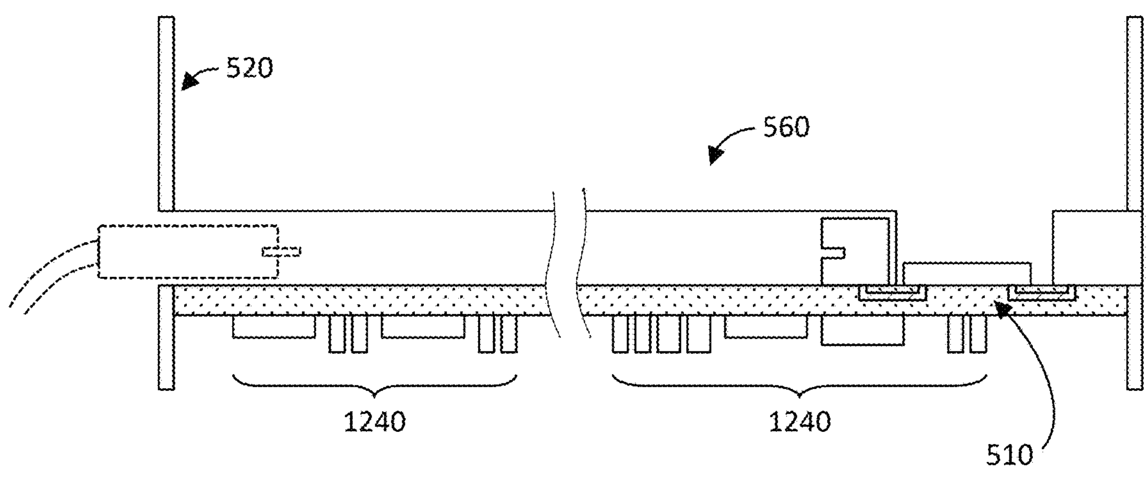
FIG. 12
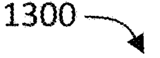
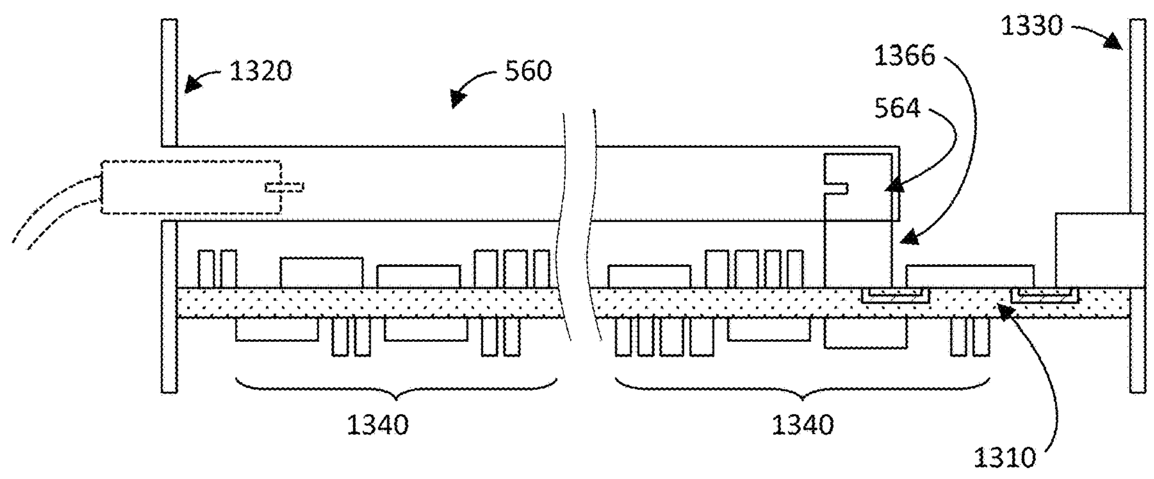
FIG. 13

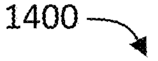
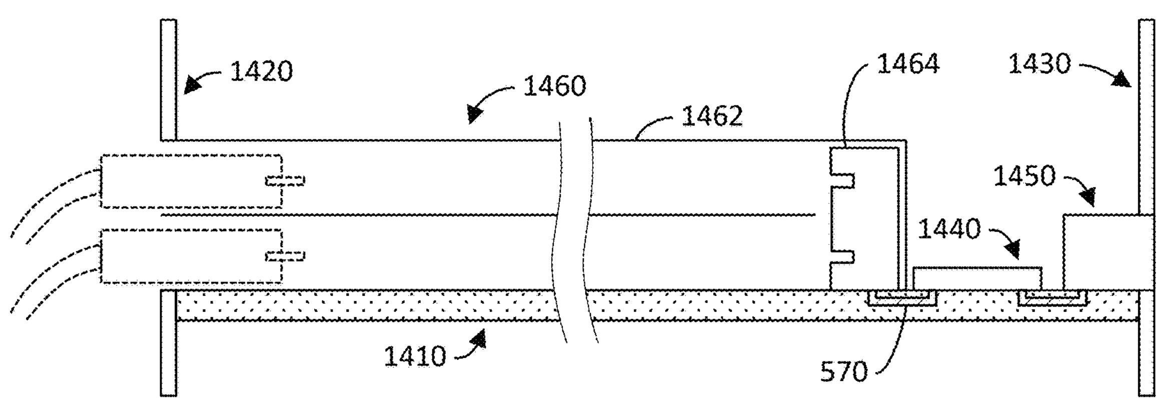
FIG. 14
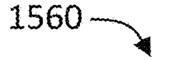
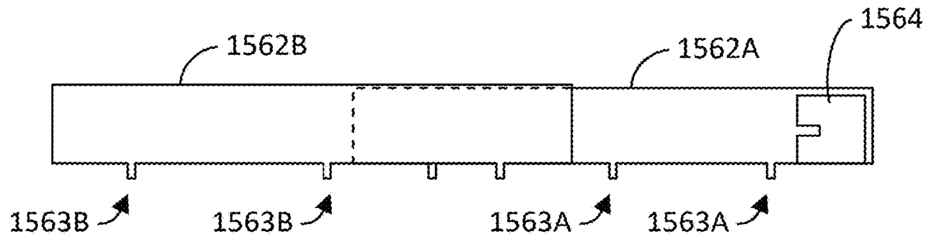
FIG. 15

DEEP PLUGGABLE RECEPTACLE

REFERENCES

This application claims priority from U.S. provisional patent application Ser. No. 63/956,688, entitled "Deep Pluggable Receptacle," filed on Jan. 9, 2026.

The priority application is hereby incorporated by reference, as if it is set forth in full in this specification.

This application is related to U.S. patent application Ser. No. 19/412,812, entitled "Pluggable Transceiver and Receptacle Modules with High Pin Count Electrical Contact Array," filed on Dec. 8, 2025, by the same inventors and applicant, and co-owned by the same assignee. The related patent application is hereby incorporated by reference, as if it is set forth in full in this specification.

Each publication, patent, and/or patent application mentioned in this specification is herein incorporated by reference in its entirety to the same extent as if each individual publication and/or patent application was specifically and individually indicated to be incorporated by reference.

BACKGROUND

Technical Field

The disclosed implementations relate to optical communications and pulse or digital communications in general, and to receptacles for small form-factor pluggable (SFP), quad SFP (QSFP), and octal SFP (OSFP) in particular.

Context

Information technology (IT) hardware, such as computer servers, is typically held and organized in server racks, for example 19" racks. Server dimensions are standardized, with a fixed width of 19 inches and heights of one or more rack units (RUs) of 1.75 inches. Racks may be, for example, anywhere between 1 and 70 RUs high. Rack depths may vary, and a rack may be, for example, anywhere up to 50 inches deep.

In many cases, the connectors at the back of the server are used for short-range connections, for example among servers located in the rack. The front of a server may hold "pluggable" receptacles for transceivers and/or optical pluggable modules for long-range connections, for example between servers in different racks, or even in different buildings or campuses. Long-range communications typically use fiberoptics, whereas short-range connections may use either fiberoptics or copper for data transfer.

Data communication and artificial intelligence (AI) processors, such as application-specific integrated circuits (ASICs), systems-on-chip (SOCs), graphic processor units (GPUs), tensor processor units (TPUs), coarse-grain reconfigurable architectures (CGRAs), field-programmable gate arrays (FPGAs), complex-instruction set computer (CISC) and reduced instruction set computer (CISC) processors, etc., are usually placed near the back of the server to reduce the length of printed circuit board (PCB) interconnections with the short-range communication connectors. However, as a result, pluggable receptacles may be located far from the high-speed data communication integrated circuits (ICs). Various approaches exist to mitigate loss of bandwidth, increased latency, and power dissipation that result from long PCB tracks. However, these approaches have various drawbacks.

The subject matter discussed in this section should not be assumed to be prior art merely because of its mention in this section. Similarly, a problem mentioned in this section or associated with the subject matter provided as background should not be assumed to have been previously recognized in the prior art. The subject matter in this section merely represents different approaches, which in and of themselves can also correspond to implementations of the claimed technology.

BRIEF DESCRIPTION OF THE DRAWINGS

The technology will be described with reference to the drawings, in which:

FIG. 1 illustrates a cross sectional view of a conventional compute server with a pluggable receptacle at the front and a high-speed data processing IC at the back near a short-range communication interconnector. Long PCB tracks in between the pluggable receptacle and the IC cause signal and bandwidth loss, latency, and power dissipation.

FIG. 2 illustrates a co-packaged optics (CPO) solution, where the data processing IC is mounted on the same substrate as a photonics interface chip, and data between the pluggable receptacle and the photonics interface chip is transferred optically.

FIG. 3 illustrates yet another conventional solution, using near-packaged optics (NPO). Data is communicated via an optical fiber from the receptacle to a photonics interface chip that is mounted on the PCB near the data processing IC.

FIG. 4 illustrates another conventional solution, where the data is transferred via one or more transmission lines, for example micro-coaxial cables or twisted pairs.

FIG. 5 illustrates an implementation of the technology disclosed herein, where the interface in the pluggable receptacle is located "deep" inside the server, next to the data processor IC.

FIG. 6 illustrates an example data communication system wherein receptacle assembly 560 is configured for receiving a pluggable module with a landing pad 581 with a two-dimensional array of electrical contact pads at its bottom.

FIGS. 7A-C illustrate examples where the transfer subsystem 562 includes or is a guide rail. FIG. 7A shows data processing system 500 with a guide rail on which the pluggable module 580 rides from the entrance 561 to the interface 564. FIG. 7B shows an example guide rail that includes multiple segments 562-1 . . . 2. FIG. 7C shows an example raised guide rail 562A with risers 562B so that the transfer subsystem leaves room for electronic components on PCB 510.

FIGS. 8A-B illustrate example usage of the guide rail.

FIGS. 10A, 10B, and 10C show examples of release and pull mechanisms. FIG. 10A shows the data processing system with the pluggable module in contact with the interface, deep inside the data processing system. FIG. 10A shows a top view of an implementation of a pluggable module where the release cord attaches to the pull tab. In FIG. 10C, another example pluggable module includes two catches (for example, spring strips) whose spring action naturally forces the hooked part of the catches outside of the pluggable module.

FIG. 12 shows an example implementation where one side of the PCB is densely populated with electronic components, and the other side of the PCB has one or more deep pluggable receptacle assemblies.

FIG. 13 shows an example implementation where the deep pluggable receptacle assembly is elevated above the PCB to leave room for electronic components.

FIG. 14 shows an example stacked receptacle implementation.

FIG. 15 illustrates an example extendable receptacle.

Figure 9A:
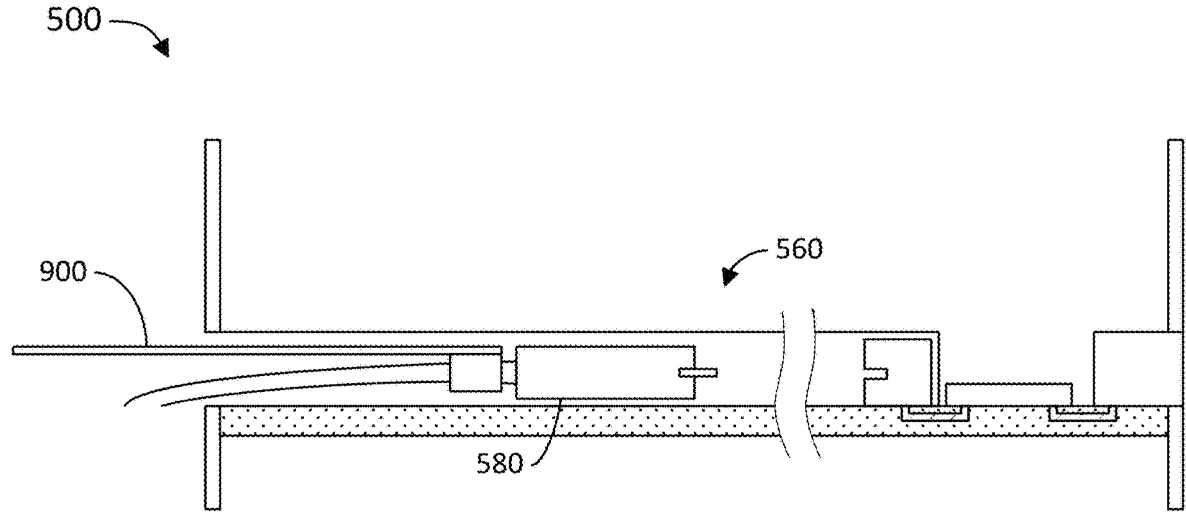
FIGS. 9A and 9B show an example push rod to move a pluggable module towards the interface deep into the receptacle assembly.

In the figures, like reference numbers may indicate functionally similar elements. The systems and methods illustrated in the figures—and described in the Detailed Description below—may be arranged and designed in a wide variety of different implementations. Neither the figures nor the Detailed Description are intended to limit the scope as claimed. Instead, they merely represent examples of different implementations.

DETAILED DESCRIPTION

IT hardware, such as computer servers, are typically held and organized in server racks, for example 19" racks. Server dimensions are standardized, with a fixed width of 19 inches and heights of one or more rack units (RUs) of 1.75 inches. Racks may be, for example, anywhere between 1 and 70 RUs high. Rack depths may vary, and a rack may be, for example, anywhere up to 50 inches deep.

In many cases, the connectors at the back of the server are used for short-range connections, for example among servers located in the rack. The front of a server may hold "pluggable" receptacles for transceivers and/or optical pluggable modules for long-range connections, for example between servers in different racks, or even in different buildings or campuses. Long-range communications typically use fiberoptics, whereas short-range connections may use either fiberoptics or copper for data transfer.

Data processor chips, such as application-specific integrated circuits (ASICs), systems-on-chip (SOCs), graphic processor units (GPUs), tensor processor units (TPUs), coarse-grain reconfigurable architectures (CGRAs), field-programmable gate arrays (FPGAs), complex-instruction set computer (CISC) and reduced instruction set computer (RISC) processors, etc., are usually placed near the back of the server to reduce the length of printed circuit board (PCB) interconnections with the short-range communication connectors. However, as a result, pluggable receptacles may be located far from the high-speed data processing integrated circuits (ICs). Various approaches exist to reduce the loss of bandwidth, and increased latency and power dissipation that result from long PCB tracks. However, these approaches have various drawbacks.

The technology disclosed herein takes the pluggable module into a "deep pluggable" receptacle, whose electrical or optical interface is located not near the front panel, but near the data processing IC. To reach the interface, the pluggable module travels on or in a transfer subsystem to the interface, where it is securely latched in place as long as needed. The transfer subsystem may include a tunnel structure and/or a guard rail with or without a carriage that transports the pluggable module between the transfer subsystem entrance and the interface. The latch to secure the pluggable module in place may be included in the pluggable module or it may be included in the transfer subsystem.

Terminology

As used herein, the phrase "one of" should be interpreted to mean exactly one of the listed items. For example, the phrase "one of A, B, and C" should be interpreted to mean any of: only A, only B, or only C.

As used herein, the phrases "at least one of" and "one or more of" should be interpreted to mean one or more items. For example, the phrase "at least one of A, B, or C" or the phrase "one or more of A, B, or C" should be interpreted to mean any combination of A, B, and/or C. The phrase "at least one of A, B, and C" means at least one of A and at least one of B and at least one of C.

Unless otherwise specified, the use of ordinal adjectives first, second, third, etc., to describe an object, merely refers to different instances or classes of the object and does not imply any ranking or sequence.

The terms "comprising" and "consisting" have different meanings in this patent document. An apparatus, method, or product "comprising" (or "including") certain features means that it includes those features but does not exclude the presence of other features. On the other hand, if the apparatus, method, or product "consists of" (or "contains") certain features, the presence of any additional features is excluded.

The term "coupled" is used in an operational sense and is not limited to a direct or an indirect coupling. "Coupled to" is generally used in the sense of directly coupled, whereas "coupled with" is generally used in the sense of directly or indirectly coupled. Coupled in an electronic system may refer to a configuration that allows a flow of information, signals, data, or physical quantities such as electrons between two elements coupled to or coupled with each other. In some cases, the flow may be unidirectional, in other cases the flow may be bidirectional or multidirectional. Coupling may be galvanic (in this context meaning that a direct electrical connection exists), capacitive, inductive, electromagnetic, optical, or through any other process allowed by physics.

The term "connected" is used to indicate a direct connection, such as electrical, optical, electromagnetic, or mechanical, between the things that are connected, without any intervening things or devices.

The terms "interconnect" and "interconnection" are used to indicate (an) electrical coupling or (a) photonic coupling, which may be direct or indirect.

The term "configured" to perform a task or tasks is a broad recitation of structure generally meaning having circuitry that performs the task or tasks during operation. As such, the described item can be configured to perform the task even when the unit/circuit/component is not currently on or active. In general, the circuitry that forms the structure corresponding to configured to may include hardware circuits, and may further be controlled by switches, fuses, bond wires, metal masks, firmware, and/or software. Similarly, various items may be described as performing a task or tasks, for convenience in the description. Such descriptions should be interpreted as including the phrase configured to.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B". This phrase specifies that B is a factor that is used to determine A or that affects the determination of A. This phrase does not foreclose that the determination of A may also be based on some other factor, such as C. This phrase is also intended to cover an implementation in which A is determined based solely on B. The phrase based on is thus synonymous with the phrase based at least in part on.

The terms "substantially", "close", "approximately", "near", and "about" refer to being within minus or plus 20% of an indicated value, unless explicitly specified otherwise.

The following terms or acronyms used herein are defined at least in part as follows:

"AI"—artificial intelligence
"ASIC"—application-specific integrated circuit
"CGRA"—coarse-grain reconfigurable architecture
"CISC"—complex-instruction-set computer
"CPO"—co-packaged optics
"EMI"—electromagnetic interference
"FPGA"—field-programmable gate array
"GPU"—graphic processor unit
"IC"—integrated circuit—a monolithically integrated circuit, i.e., a single semiconductor die which may be delivered as a bare die or as a packaged circuit. For the purposes of this document, the term integrated circuit also includes packaged circuits that include multiple semiconductor dies, stacked dies, or multiple-die substrates. Such constructions are now common in the industry, produced by the same supply chains, and for the average user often indistinguishable from monolithic circuits.
"IT"—information technology
"LGA"—land grid array—a type of integrated circuit (IC) packaging that uses flat, metallic pads (lands) on the bottom of the chip instead of pins or solder balls for connection to a circuit board.
"NPO"—near-packaged optics
"OSFP"—octal small form-factor pluggable
"PCB"—printed circuit board
"QSFP"—quad small form-factor pluggable
"RISC"—reduced-instruction-set computer
"RU"—rack unit
"SFP"—small form-factor pluggable
"SOC"—systems-on-chip
"TPU"—tensor processor unit

Implementations

FIG. 1 illustrates a cross sectional view of a conventional compute server 100 with a pluggable receptacle 160 at the front and a high-speed data processing IC 140 at the back near a short-range communication socket 150. Compute server 100 further includes a printed circuit board (PCB 110), a front panel 120, and a rear panel 130. Receptacle 160 usually includes a metal cage 162 to protect against electromagnetic interference (EMI) and an edge connector socket 164 positioned to receive a pluggable transceiver 180. Typically, front panel 120 has multiple units of receptacle 160, configured for long-haul communication (for example, between different racks of compute servers, perhaps in other rooms or other buildings), and rear panel 130 has multiple units of short-range communication socket 150. The data processing ICs 140 are located near the short-range communication sockets 150 to prevent loss of performance between data processing IC 140 and short-range communication socket 150. However, as a result, PCB tracks 170 between receptacle 160 and data processing IC 140 are long, and loss of performance, signal, signal integrity (SI), and power occurs in PCB tracks 170.

FIG. 2 illustrates a co-packaged optics (CPO) solution 200, where the data processing IC 240 is mounted on a common substrate 248 with a photonics interface chip 245, and data between the receptacle 260 and the photonics interface chip 245 is transferred optically. In such a case, receptacle 260 includes an optical interface element 264 instead of an edge connector socket. A fiberoptic cable 270 optically couples signals from a pluggable module 280 to photonics interface chip 245. While this solution prevents the problems discussed with reference to FIG. 1, it is also an expensive solution. And it is not applicable if the long-haul communication uses a copper cable and a transceiver to provide its data to the compute server.

FIG. 3 illustrates yet another conventional solution 300, using near-packaged optics (NPO). Data is communicated via an optical fiber 370 from the receptacle 360 to a photonics interface chip 345 that is mounted on PCB 310 near data processing IC 340. Like the solution in FIG. 2, this approach mostly prevents the problems discussed with reference to FIG. 1. It is not as expensive as CPO. However, the data traveling between photonics interface chip 345 and data processing IC 340 is transferred via PCB tracks 372, which reintroduces some loss of performance, signal, signal integrity, and power. Additionally, the solution is not useful where the long-haul communication uses a copper cable and a transceiver to provide its data to the compute server.

FIG. 4 illustrates a further conventional system 400, where the data is transferred via one or more copper cables 470, for example micro-coaxial cables or twisted pairs. This system is also known as a flyover system. In this case, receptacle 460 is configured to receive a transceiver 480 which interfaces (on the server side) with electrical signals. The edge connector in receptacle 460 is coupled with a cable connector 445 via PCB tracks 474. The other side of copper cable 470 is coupled with data processor IC 440 via another cable connector 445 and PCB tracks 472. While this system reduces the problems discussed with reference to FIG. 1, it is not a low-cost solution, and it may not always be easy to achieve the best performance.

FIG. 5 illustrates an implementation of the technology disclosed herein, where the interface in the pluggable receptacle is located "deep" inside the server, next to the data processor IC. Data processing system 500, which may be a compute server, an artificial intelligence (AI) accelerator system, data communications equipment, or any other system that processes high-bandwidth data that may be communicated over long distances, includes a PCB 510, and has a front panel 520 with one or more entrances 561 configured to receive pluggable modules 580, for example transceivers connected with optical or metal (e.g., copper) cables 583 or photonic interfaces to receive and/or transmit optical signals from or to fiberoptic cables. Data processing system 500 may have a rear panel 530, which may have one or more short-range communication sockets 550, for example for use with copper cables. A data processor IC 540 is electrically and mechanically coupled with PCB 510. For example, data processor IC 540 may be soldered onto PCB 510, or inserted into a socket that is mounted on PCB 510.

Conventional pluggable modules, such as shown in FIGS. 1-4, have a length of about 9 cm (89 mm). According to the "OSFP MSA Specification for OSFP Octal Small Form Factor Pluggable Modules" standard, rev 5.22, FIG. 5-6, about 7 cm (68.4 mm) of the pluggable module travels into the cage and at least about 2 cm (21.39 mm) protrudes from the cage. In our implementations, because the cage or guide rail reaches close to data processor IC 540, the whole pluggable module may be inserted and travel inside data processing system 500. For example, data processor IC 540 may be located at least twelve centimeters (12 cm) away from the front panel, and/or may be close to the short-range communication socket 550, and therefore close to rear panel 530, for example within 5 centimeters. The transfer depth is the distance between the entrance of the transfer subsystem and the interface (e.g., edge connector socket 164). Thus, the transfer depth of the receptacle 160 may be twelve centimeters (12 cm) or more).

Data processor IC 540 may be electrically coupled with the short-range communication socket 550. PCB 510 may include an FR4 (flame retardant grade 4) material, or any other material used for PCBs.

A receptacle assembly 560 is mounted on or below PCB 510. It has its entrance 561 at front panel 520 and includes a transfer subsystem 562 to receive pluggable module 580 and securely engage pluggable module 580 with an interface 564. Interface 564 may be mechanically coupled with the transfer subsystem and is configured to mate with pluggable modules 580 and to reliably transfer signals between pluggable module 580 and PCB 510 or between any other electronic and photonic circuitry coupled with PCB 510. Interface 564 may be an edge socket for electrical contact pads on a pluggable transceiver module (as drawn), or a two-dimensional contact array socket, such as disclosed in U.S. patent application Ser. No. 19/412,812, entitled "Pluggable Transceiver and Receptacle Modules with High Pin Count Electrical Contact Array," or a photonic interface to transfer optical signals to and/or from, for example, a photonics IC. In cases where interface 564 is an edge socket or a two-dimensional contact array socket such as a land grid array (LGA) socket, the socket exposes multiple electrical contacts configured to mate with contact pads of a pluggable transceiver module. However, if interface 564 is a photonic interface, its inputs and outputs may all be optical, and there may be no electric signals involved. Instead, it is configured to send or receive optical signals to or from one or more optical fibers that end in pluggable module 580.

Transfer subsystem 562 may include a tunnel, as drawn, and/or a guide rail, or any other system that can guide pluggable module 580 from the entrance at the front panel 520 to the interface 564, and vice versa. The transfer depth, i.e., the distance between the entrance of the transfer subsystem (at the front panel) and interface 564, may be at least fifteen centimeters (15 cm). In some implementations it may be more than 30 or even more than 50 centimeters. Because interface 564 can be placed close to data processor IC 540, PCB tracks 570 can be short, introducing relatively little parasitic inductance, capacitance, and resistance, and thus limiting loss of performance, signal integrity, and power.

In implementations where transfer subsystem 562 includes a guide rail, the guide rail may be made from a suitable material (e.g., a plastic or a metal) in a single segment, or it may be built from multiple chainable segments, so that the receptacle assembly's transfer depth can be determined by the number of chainable segments. While the transfer depth does not need to exactly equal the total length of the chained segments, the number of chainable segments is associated with the transfer depth. A greater transfer depth generally requires a greater number of chainable segments. The guide rail may act like a monorail and may have a feature that can be enveloped by a matching feature of pluggable module 580, so that the pluggable module is forced to stay in contact with the guide rail as long as pluggable module 580 is inside data processing system 500.

In some implementations, transfer subsystem 562 may include a cage to shield sensitive electric signals from electromagnetic interference (EMI). The cage includes a conductive material on one or more of its surfaces, to act as a cage of Faraday. In some cases, the cage and the tunnel in the transfer subsystem can be combined. In other words, the tunnel can act as the cage that reduces EMI.

Transfer subsystem 562 may further include a carriage that rides on the guide rail or that travels inside the cage or tunnel, so that the pluggable module 580 needs no specific adaptations to stay coupled with the guide rail. In such an implementation, the carriage may provide EMI shielding and it may include a flap door to provide EMI shielding.

FIG. 6 illustrates an example data communication system wherein receptacle assembly 560 is configured for receiving a pluggable module with a landing pad 581 with a two-dimensional array of electrical contact pads at its bottom. Pluggable module 580 has a module slide feature 585 at its sides, for example a raised strip as shown, or an indentation. Transfer subsystem 562 includes one or more slide support rails 566 to support pluggable module 580 at module slide feature 585. It further includes a guide rail 565 suspended on rotatable arms. Guide rail 565 is configured to receive pluggable module 580 and move it down towards interface 564, which may be an LGA socket, so that landing pad 581 can securely engage with the two-dimensional array of electrical contacts in the LGA.

FIGS. 7A-C illustrate examples where the transfer subsystem 562 includes or is a guide rail. FIG. 7A shows data processing system 500 with a guide rail on which pluggable module 580 rides from the entrance 561 to the interface 564. The guide rail allows PCB edge connector 582 to accurately enter and engage with interface 564. FIG. 7B shows an example guide rail that includes multiple segments 562-1 . . . 2, etc. Segments may be chainable or linkable and may have alignment features such as a recession 562R at one end and a matching bump (not shown) at the other end. FIG. 7C shows an example raised guide rail 562A with risers 562B so that the transfer subsystem leaves room for electronic components on PCB 510.

FIGS. 8A-B illustrate example usage of the guide rail. FIG. 8A shows a front perspective view in which pluggable module 580 includes a monorail slider 584 that can envelope the top part of the guide rail and slide over it. FIG. 8B shows a rear perspective view in which a carriage 590 includes a monorail slider 594 that can envelope the top part of the guide rail and slide over it. Carriage 590 may be made of or include a conductive material so that it can act as a cage of Faraday and reduce or eliminate EMI. It may feature a front flap 596 also for reduction of EMI.

Figure 9B:
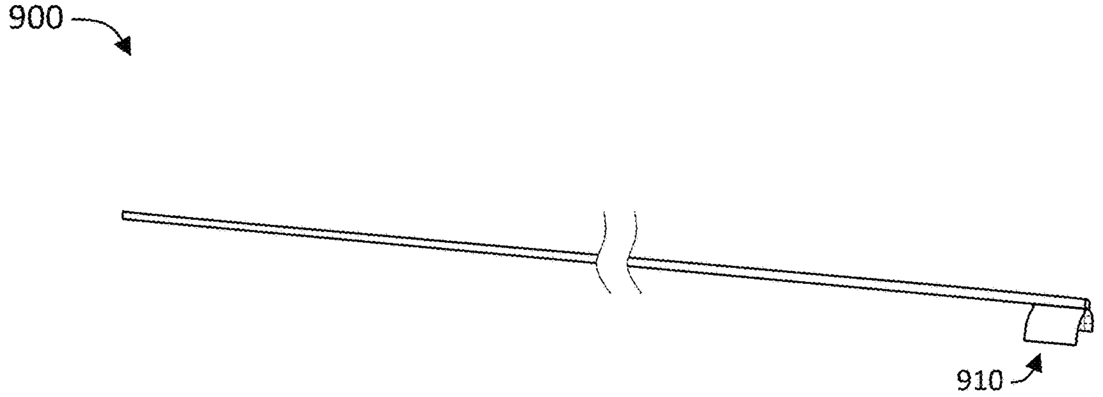

FIGS. 9A and 9B show an example push rod 900 to move pluggable module 580 towards interface 564 deep into receptacle assembly 560. FIG. 9A shows data processing system 500 including pluggable modules 580 being pushed forward by push rod 900. FIG. 9B shows the example push rod 900 in a slightly rotated perspective. At its end, it may have a feature 910 that increases the push area at its front and that can slide over the cable connected to pluggable module 580.

FIGS. 10A, 10B, and 10C show examples of release and pull mechanisms. When the pluggable module 580 is engaged with interface 564, it is locked in place by a latching mechanism. The latching mechanism can be included in pluggable module 580 as shown in FIG. 10B and FIG. 10C, with latch openings in the transfer subsystem (for example in the EMI cage or the tunnel), or it can be included in the transfer subsystem (not drawn) with latch openings in pluggable module 580. In some cases, the latching mechanism doesn't work with openings but with protrusions, and the pluggable module includes the latching mechanism while the transfer subsystem includes the protrusion(s), or the transfer subsystem includes the latching mechanism, and the pluggable module includes the protrusion(s).

FIG. 10A shows data processing system 500 with pluggable module 580 in contact with interface 564, deep inside data processing system 500. A release cord 1000 is attached to pluggable module 580, and a user can pull release cord 1000 to first release the latching mechanism and then pull pluggable module 580 back from inside data processing system 500.

FIG. 10B shows a top view of an implementation of a pluggable module 580 where release cord 1000 attaches to the pull tab 1020. Pull tab 1020 is coupled with the latch mechanism, which may be at the bottom of the pluggable module (as is common today), and which releases when pull tab 1020 is pulled.

In FIG. 10C, another example pluggable module 580 includes two catches 1081 (for example, spring strips) whose spring action naturally forces the hooked part of catches 1081 outside of pluggable module 580. When pluggable module 580 travels through the tunnel, the hooked parts of catches 1081 are mostly or fully forced back inside pluggable module 580 until they come across matching openings in the side of the tunnel. Matching openings at the right distance from interface 564 will lock pluggable module 580 in place, and the hooked parts prevent that pluggable module 580 inadvertently unplugs. Two ends of a release cord 1000 are each attached to one of the catches 1081, and when a user pulls release cord 1000 the catches 1081 are pulled back inside pluggable module 580, where they may rest fully or partially in a latch pocket (not drawn). When they are fully retracted, release cord 1000 pulls pluggable module 580 towards the receptacles entrance, where it can be retrieved by the user. Pluggable module 580 may include one or more spindles 1082 (rotating or non-rotating) to redirect the tension of release cord 1000, so that it can fully pull back the catches 1081 before starting the module's reverse journey. The catches may be made from any material that is sufficiently durable, strong, and that provides spring action, for instance metal. Release cord 1000 may have a tab 1010 at its end to facilitate pulling. The tab may also include written text to identify the cable 583. Some implementations may have another means for releasing a catch than release cord 1000, for example a thin metal rod that can push, pull, or turn an element in the release mechanism and pull in a catch 1081.

Figures 11A, 11B:
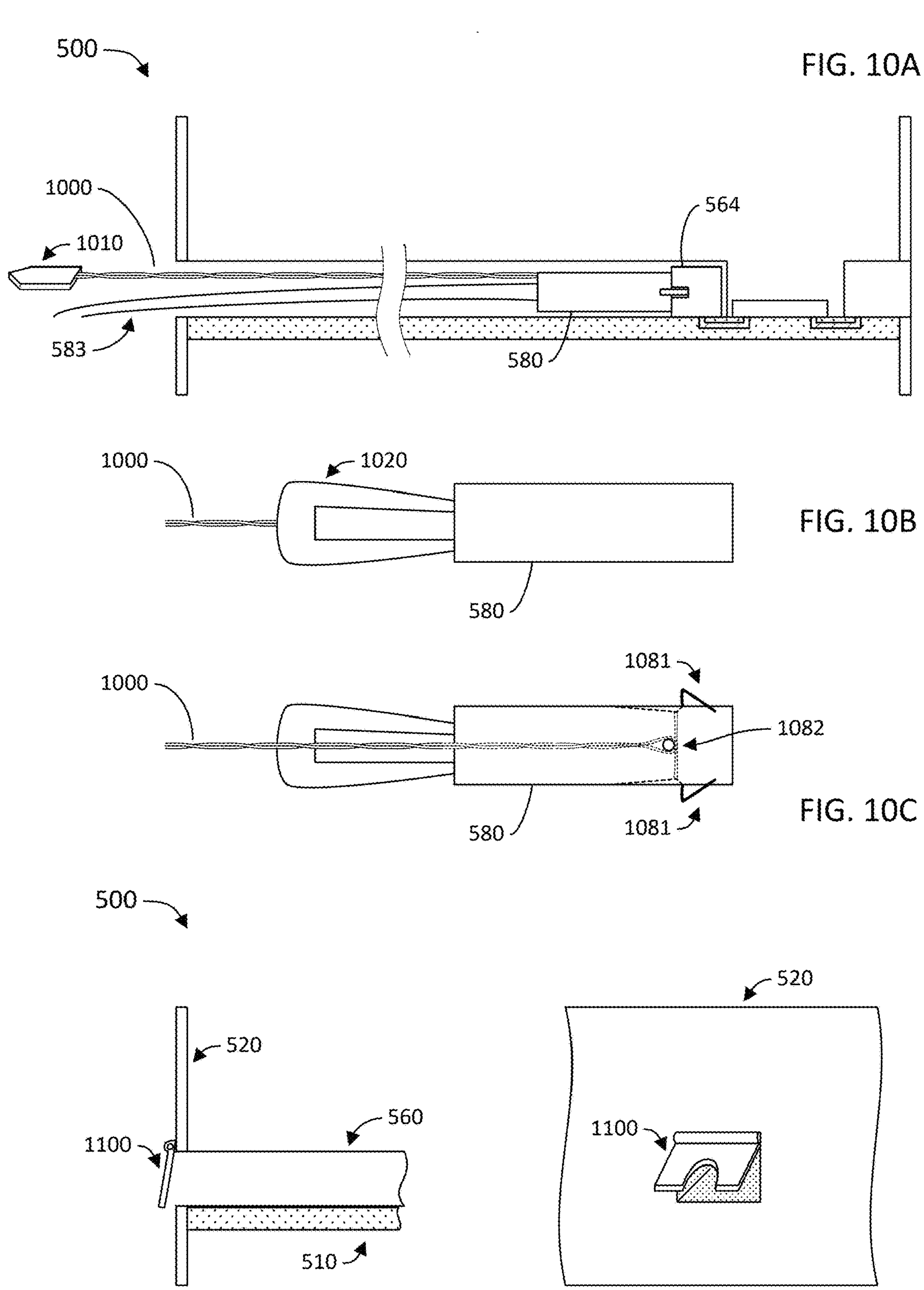
FIGS. 11A and 11B show an example flap door of a conductive material, located at the front of the server, and used for shielding against electromagnetic interference (EMI).

FIGS. 11A and 11B show an example flap door 1100 of a conductive material, located at the front of the server, and used for shielding against electromagnetic interference (EMI). FIG. 11A shows a cross sectional side view of front panel 520, part of PCB 510, and part of receptacle assembly 560. Flap door 1100 may be mounted at the top of receptacle assembly 560 so that it naturally closes from gravity, or it may include a spring mechanism to keep it closed and be attached to the top, a side, or the bottom of receptacle assembly 560. FIG. 11B shows a perspective view of front panel 520 with flap door 1100. It may have a recess or cutout (as drawn) to allow a cable 583 of a pluggable module 580 through while the pluggable module is inside receptacle assembly 560.

FIG. 12 shows an example implementation where one side of the PCB 510 is densely populated with electronic components 1240, and the other side of PCB 510 has one or more deep pluggable receptacle assemblies 560. Although in this example the electronic components 1240 are shown at the bottom and the receptacle assembly 560 is shown at the top, in other implementations this may be the reverse, or the PCB may be oriented vertically.

FIG. 13 shows an example data processing system 1300 where the receptacle assembly 560 is elevated above the PCB 1310 to leave room for electronic components 1340. In this example, the front of receptacle assembly 560 is supported by front panel 1320 where it is mounted at the entrance for a pluggable module. The back of receptacle assembly 560 is supported by a tower element 1366 which raises it and provides electrical connectivity between electrical contacts of interface 564 and PCB 1310. In some cases, tower element 1366 receives optical signals from interface 564 and/or sends optical signals to interface 564, and tower element 1366 includes photonic and/or electronic circuitry to translate the optical signals into electrical signals, and/or vice versa. Tower element 1366 may further include other elements, such as interposers.

FIG. 14 shows an example stacked receptacle implementation. In this data processing system 1400, a stacked receptacle assembly 1460 saves PCB 1410 real estate. Data processing system 1400 further includes a front panel 1420 with two or more entrances to receive pluggable modules 580. Data processing system 1400 may have a rear panel 1430, which may have one or more short-range communication sockets 1450, for example for use with copper cables. A data processor IC 1440 is electrically and mechanically coupled with PCB 1410. For example, data processor IC 1440 may be soldered onto PCB 1410, or inserted into a socket that is mounted on PCB 1410. Data processor IC 1440 may be located at least 15 centimeters (15 cm) away from the front panel, and/or close to the short-range communication sockets 1450, and therefore close to rear panel 1430, for example within 5 centimeters. Data processor IC 1440 may be electrically coupled with the short-range communication socket 1450.

Stacked receptacle assembly 1460 is mounted on or below PCB 1410. It has its entrances at front panel 1420 and includes two or more transfer subsystems 1462 to receive pluggable modules 580 and securely engage the pluggable modules 580 with the stacked interface 1464. Stacked interface 1464 may be mechanically coupled with 1410 or with the transfer subsystem and is configured to reliably mate with pluggable modules 580. Stacked interface 1464 may transfer electric signals between pluggable module 580 and PCB 1410 or any other electronic circuitry coupled with PCB 1410. Stacked interface 1464 may include an edge socket for electrical contact pads on a pluggable transceiver module (as drawn), and/or a two-dimensional contact array socket, such as disclosed in U.S. patent application Ser. No. 19/412,812, entitled "Pluggable Transceiver and Receptacle Modules with High Pin Count Electrical Contact Array," or a photonic interface to transfer optical signals to and/or from, for example, a photonics IC. In cases where stacked interface 1464 is an edge socket or a two-dimensional contact array socket such as a land grid array (LGA) socket, the socket exposes multiple electrical contacts configured to mate with contact pads of a pluggable transceiver module. However, if stacked interface 1464 is a photonic interface, its inputs and outputs may all be optical, and there may be no electric signals involved. Instead, it is configured to exchange optical signals with one or more optical fibers that end in pluggable module 580.

Transfer subsystem 1462 may include a tunnel, as drawn, and/or a guide rail, or any other system that can guide pluggable module 580 from the entrance at the front panel 520 to the stacked interface 1464. The transfer depth, i.e., the distance between the entrance of the transfer subsystem and stacked interface 1464, may be at least 15 centimeters. In some implementations it may be more than 30 or even more than 50 centimeters.

In some implementations, transfer subsystem 1462 may include a cage to shield sensitive electric signals from EMI. The cage includes a conductive material on one or more of its surfaces, to act as a cage of Faraday. In some cases, the cage and the tunnel in the transfer subsystem can be combined. In other words, the tunnel can act as the cage that reduces EMI.

FIG. 15 illustrates an example extendable receptacle 1560. Extendable receptacle 1560 includes two (or more) partial transfer subsystems 1562A-B that can slide in and over each other, so that the resulting length can be varied. In the drawing, partial transfer subsystem 1562A slides inside partial transfer subsystem 1562B. Partial transfer subsystem 1562A includes interface 1564, which may be the same as interface 564 or stacked interface 1464 described earlier in this document. The partial transfer subsystems 1562A-B may create a tunnel (as drawn) or a guard rail. They may have cage pins 1563A and cage pins 1563B, which can be used to fix the transfer depth by placing them in matching openings in the PCB.

PARTICULAR IMPLEMENTATIONS

Described implementations of the subject matter can include one or more features, alone or in combination, as described in the following clauses.

Clause 1. A data processing system (500, 1300, 1400), comprising:
- a PCB (510, 1310, 1410);
- a front panel (520, 1320, 1420) located at or near an edge of the PCB;
- a rear panel (530, 1330, 1430) located at or near another edge of the PCB;
- a data processor integrated circuit (a data processor IC) (540) or data processor module electrically and mechanically coupled with the PCB more than fifteen centimeters (12 cm) from the front panel; and
- a receptacle assembly (560, 1460) configured to receive a pluggable module (580), wherein the receptacle assembly has an entrance (561) at the front panel, and wherein the receptacle assembly comprises:
  - a transfer subsystem (562) to receive the pluggable module and securely engage the pluggable module with an interface (564);
  - wherein:
    - the interface is mechanically coupled with the transfer subsystem;
    - the interface is configured to mate with the pluggable module and to reliably transfer signals between the pluggable module and the PCB or another electronic or photonic circuitry coupled with the PCB;
    - the transfer subsystem has a transfer depth of at least 12 centimeters; and
    - the transfer depth is a distance between the entrance of the transfer subsystem and the interface.

Clause 2. The data processing system of clause 1, wherein the interface is one of a socket exposing multiple electrical contacts and a photonic interface to receive optical signals from one or more optical fibers.

Clause 3. The data processing system of clause 1 or clause 2, wherein the pluggable module is one of a pluggable transceiver that exposes electrical contact pads and a pluggable photonic module that exposes optical fiber ends.

Clause 4. The data processing system of any of the clauses 1 to 3, further comprising:
- a cage (562, 1462) including a conductive material configured to reduce EMI.

Clause 5. The data processing system of clause 4, wherein the cage is at least a part of the transfer subsystem.

Clause 6. The data processing system of any of the clauses 1 to 5, further comprising:
- a short-range communication socket on the rear panel and electrically coupled with the data processor IC.

Clause 7. A receptacle (560, 1460) for pluggable modules, comprising:
- a transfer subsystem (562, 1462) to receive a pluggable module (580) and securely engage the pluggable module with an interface (564, 1464), wherein:
  - the interface is mechanically coupled with the transfer subsystem;
  - the interface is configured to mate with the pluggable module and to reliably transfer optical signals and/or electric signals between the pluggable module and a printed circuit board (PCB) (510, 1310, 1410) and/or another electronic or photonic circuitry coupled with the PCB;
  - the transfer subsystem has a transfer depth of at least 12 centimeters; and
  - the transfer depth is a distance between an entrance (561) of the transfer subsystem and the interface.

Clause 8. The receptacle of clause 7, wherein:
- the interface is mechanically coupled with the transfer subsystem via the PCB.

Clause 9. The receptacle of any of the clauses 7 to 8, wherein:
- the transfer subsystem (1560) is extendable, and the transfer depth can be fixed by placing cage pins (1563A-B) in matching openings in a PCB.

Clause 10. The receptacle of any of the clauses 7 to 9, further comprising a cage including conductive material configured to reduce or eliminate electromagnetic interference (EMI).

Clause 11. The receptacle of clause 10, wherein the cage is at least a part of the transfer subsystem.

Clause 12. The receptacle of any of the clauses 7 to 11, wherein the interface is one of a socket exposing multiple electrical contacts and a photonic interface to receive the optical signals from one or more optical fibers and/or transmit the optical signals into the one or more optical fibers.

Clause 13. The receptacle of any of the clauses 7 to 12, wherein:
- the interface is one of:
  - a PCB edge connector socket configure to mate with contact pads at a top and/or at a bottom of a pluggable module PCB near an edge (582) of the pluggable module PCB; and
  - a two-dimensional contact array socket configured to mate with contact pads at a bottom or a top of the pluggable module.

Clause 14. The receptacle of any of the clauses 7 to 13, further comprising:
- one or more mechanical features configured to engage with one or more latching mechanisms on the pluggable module to latch the pluggable module in place while it is in contact with the interface.

Clause 15. The receptacle of any of the clauses 7 to 13, further comprising:
- one or more latching mechanisms configured to engage with one or more mechanical features of the pluggable module and to latch the pluggable module in place while it is in contact with the interface.

Clause 16. The receptacle of any of the clauses 7 to 15, wherein the transfer subsystem includes a release mechanism (1000) to release a latching mechanism that latches the pluggable module in place while it is in contact with the interface.

Clause 17. The receptacle of any of the clauses 7 to 16, further comprising:

a tower element (1366) configured to raise at least a part of the receptacle and to provide electrical connectivity between electrical contacts of the interface and the PCB.

Clause 18. The receptacle of any of the clauses 7 to 17, wherein:

the receptacle (1460) has a stacked configuration to receive multiple transceiver modules.

Clause 19. The receptacle of any of the clauses 7 to 18, wherein:

the transfer subsystem includes a guide rail and/or a carriage (590) configured to receive and transport the pluggable module.

Clause 20. The receptacle of any of the clauses 7 to 19, wherein:

the transfer subsystem is extendable and includes a guide rail built from a number of chainable segments (562-1, 562-2), where the number of chainable segments is associated with the transfer depth.

Clause 21. The receptacle of any of the clauses 7 to 20, wherein:

the transfer subsystem includes a raised guide rail (562A) including one or more risers (562B).

Clause 22. The receptacle of any of the clauses 7 to 21, further comprising:

a flap door (1100) at the entrance of the transfer subsystem and/or at an entrance of a carriage (590) and wherein the flap door is configured to reduce EMI, and wherein the flap door is made of or includes a second conductive material.

CONSIDERATIONS

We describe various implementations of a receptacle for a pluggable module.

The technology disclosed can be practiced as an apparatus, method, composition of matter, or article of manufacture. One or more features of an implementation can be combined with the base implementation. Implementations that are not mutually exclusive are taught to be combinable. One or more features of an implementation can be combined with other implementations. This disclosure periodically reminds the user of these options. Omission from some implementations of recitations that repeat these options should not be taken as limiting the combinations taught in the preceding sections—these recitations are hereby incorporated forward by reference into each of the implementations described herein.

Although the description has been described with respect to specific implementations thereof, these specific implementations are merely illustrative, and not restrictive. The description may reference specific structural implementations and methods and does not intend to limit the technology to the specifically disclosed implementations and methods. The technology may be practiced using other features, elements, methods and implementations. Implementations are described to illustrate the present technology, not to limit its scope, which is defined by the claims. Those of ordinary skill in the art recognize a variety of equivalent variations on the description above.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

It will also be appreciated that one or more of the elements depicted in the drawings/figures can also be implemented in a more separated or integrated manner or even removed or rendered as inoperable in certain cases, as is useful in accordance with a particular application.

Thus, while specific implementations have been described herein, latitudes of modification, various changes, and substitutions are intended in the foregoing disclosures, and it will be appreciated that in some instances some features of specific implementations will be employed without a corresponding use of other features without departing from the scope and spirit as set forth. Therefore, many modifications may be made to adapt a particular situation or material to the essential scope and spirit.

The invention claimed is:

1. A data processing system, comprising: a PCB; a front panel located at or near an edge of the PCB; a rear panel located at or near another edge of the PCB; a data processor integrated circuit (a data processor IC) or data processor module electrically and mechanically coupled with the PCB more than twelve centimeters (12 cm) from the front panel; and a receptacle assembly configured to receive a pluggable module, wherein the receptacle assembly has an entrance at the front panel, and wherein the receptacle assembly comprises: a transfer subsystem to receive the pluggable module and securely engage the pluggable module with an interface; wherein: the interface is mechanically coupled with the transfer subsystem; the interface is configured to mate with the pluggable module and to reliably transfer signals between the pluggable module and the PCB or another electronic or photonic circuitry coupled with the PCB; the transfer subsystem has a transfer depth of at least 12 centimeters; and the transfer depth is a distance between the entrance of the transfer subsystem and the interface, wherein the interface is one of a socket exposing multiple electrical contacts and a photonic interface to receive optical signals from one or more optical fibers.

2. The data processing system of claim 1, wherein the pluggable module is one of a pluggable transceiver that exposes electrical contact pads and a pluggable photonic module that exposes optical fiber ends.

3. The data processing system of claim 1, further comprising:

a cage including a conductive material configured to reduce EMI.

4. The data processing system of claim 3, wherein the cage is at least a part of the transfer subsystem.

5. The data processing system of claim 1, further comprising:

a short-range communication socket on the rear panel and electrically coupled with the data processor IC.

6. A receptacle for pluggable modules, comprising: a transfer subsystem to receive a pluggable module and securely engage the pluggable module with an interface, wherein: the interface is mechanically coupled with the transfer subsystem; the interface is configured to mate with the pluggable module and to reliably transfer optical signals and/or electric signals between the pluggable module and a printed circuit board (PCB) and/or another electronic or photonic circuitry coupled with the PCB; the transfer subsystem has a transfer depth of at least 12 centimeters; and the transfer depth is a distance between an entrance of the transfer subsystem and the interface, wherein the interface is one of a socket exposing multiple electrical contacts and a photonic interface to receive optical signals from one or more optical fibers.

7. The receptacle of claim 6, wherein:

the interface is mechanically coupled with the transfer subsystem via the PCB.

8. The receptacle of claim 6, wherein:

the transfer subsystem is extendable, and the transfer depth can be fixed by placing cage pins in matching openings in a PCB.

9. The receptacle of claim 6, further comprising a cage including conductive material configured to reduce or eliminate electromagnetic interference (EMI).

10. The receptacle of claim 9, wherein the cage is at least a part of the transfer subsystem.

11. The receptacle of claim 6, wherein the interface is one of a socket exposing multiple electrical contacts and a photonic interface to receive the optical signals from one or more optical fibers and/or transmit the optical signals into the one or more optical fibers.

12. The receptacle of claim 6, wherein:

the interface is one of:

a PCB edge connector socket configure to mate with contact pads at a top and/or at a bottom of a pluggable module PCB near an edge of the pluggable module PCB; and a two-dimensional contact array socket configured to mate with contact pads at a bottom or a top of the pluggable module.

13. The receptacle of claim 6, further comprising:

one or more mechanical features configured to engage with one or more latching mechanisms on the pluggable module to latch the pluggable module in place while it is in contact with the interface.

14. The receptacle of claim 6, further comprising:

one or more latching mechanisms configured to engage with one or more mechanical features of the pluggable module and to latch the pluggable module in place while it is in contact with the interface.

15. The receptacle of claim 6, wherein the transfer subsystem includes a release mechanism to release a latching mechanism that latches the pluggable module in place while it is in contact with the interface.

16. The receptacle of claim 6, further comprising:

a tower element configured to raise at least a part of the receptacle and to provide electrical connectivity between electrical contacts of the interface and the PCB.

17. The receptacle of claim 6, wherein:

the receptacle has a stacked configuration to receive multiple transceiver modules.

* * * * *